United States Patent
Bamesberger et al.

(10) Patent No.: US 12,283,522 B2
(45) Date of Patent: *Apr. 22, 2025

(54) PLANARIZATION APPARATUS, PLANARIZATION PROCESS, AND METHOD OF MANUFACTURING AN ARTICLE

(71) Applicant: CANON KABUSHIKI KAISHA, Tokyo (JP)

(72) Inventors: Seth J. Bamesberger, Austin, TX (US); Ozkan Ozturk, Round Rock, TX (US); Christopher Ellis Jones, Austin, TX (US); Se-Hyuk Im, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/054,487

(22) Filed: Nov. 10, 2022

(65) Prior Publication Data

US 2023/0061361 A1 Mar. 2, 2023

Related U.S. Application Data

(63) Continuation of application No. 16/779,205, filed on Jan. 31, 2020, now Pat. No. 11,562,924.

(51) Int. Cl.
*H01L 21/76* (2006.01)
*H01L 21/321* (2006.01)
*H01L 21/768* (2006.01)
*H01L 21/67* (2006.01)

(52) U.S. Cl.
CPC .... *H01L 21/7684* (2013.01); *H01L 21/32115* (2013.01); *H01L 21/67253* (2013.01)

(58) Field of Classification Search
CPC .......... H01L 21/7684; H01L 21/32115; H01L 21/67253; H01L 21/31058; H01L 21/67092; H01L 21/28123; G03F 7/0002
See application file for complete search history.

(56) References Cited

U.S. PATENT DOCUMENTS

| | | | |
|---|---|---|---|
| 5,989,103 A * | 11/1999 | Birang | B23Q 3/1546 451/364 |
| 6,873,087 B1 * | 3/2005 | Choi | G03F 7/0002 310/323.17 |
| 7,718,545 B1 * | 5/2010 | Ng | H01L 29/66742 438/626 |
| 8,167,393 B2 * | 5/2012 | Vanheusden | H05K 3/125 347/14 |
| 8,850,980 B2 * | 10/2014 | Sreenivasan | G03B 27/42 101/485 |
| 9,718,096 B2 * | 8/2017 | Sreenivasan | H01L 21/0271 |

(Continued)

FOREIGN PATENT DOCUMENTS

| | | | | |
|---|---|---|---|---|
| JP | 2019051507 A * | 4/2019 | | G03F 7/0002 |
| JP | 2020009994 A | 1/2020 | | |

(Continued)

*Primary Examiner* — Mohammed Shamsuzzaman
(74) *Attorney, Agent, or Firm* — Canon U.S.A., Inc. I.P. Division

(57) ABSTRACT

A superstrate for planarizing a substrate. The superstrate includes a body having a first side having a contact surface and a second side having a central portion and a peripheral portion surrounding the central portion. The peripheral portion includes a recessed region.

9 Claims, 8 Drawing Sheets

(56) References Cited

U.S. PATENT DOCUMENTS

| | | | |
|---|---|---|---|
| 9,885,118 B2* | 2/2018 | Tsuji | C23F 1/16 |
| 10,040,219 B2* | 8/2018 | Takekawa | G03F 9/7076 |
| 10,892,167 B2* | 1/2021 | De Young | G03F 7/161 |
| 11,333,970 B2* | 5/2022 | Fukuhara | H01L 21/0274 |
| 11,415,882 B2* | 8/2022 | Suzaki | G03F 7/0002 |
| 11,769,667 B2* | 9/2023 | Higuchi | H01L 21/0273 |
| | | | 438/780 |
| 2004/0124566 A1* | 7/2004 | Sreenivasan | B81C 1/0046 |
| | | | 264/494 |
| 2004/0206621 A1* | 10/2004 | Li | H01L 21/67276 |
| | | | 204/229.8 |
| 2005/0270312 A1* | 12/2005 | Lad | B82Y 10/00 |
| | | | 347/1 |
| 2006/0077374 A1 | 4/2006 | Sreenivasan | |
| 2007/0026542 A1* | 2/2007 | Sreenivasan | G03F 7/0002 |
| | | | 438/10 |
| 2007/0102844 A1* | 5/2007 | Simon | B82Y 40/00 |
| | | | 264/479 |
| 2007/0114686 A1* | 5/2007 | Choi | B29C 43/003 |
| | | | 264/2.7 |
| 2007/0126440 A1* | 6/2007 | Hobbs | G01R 31/2893 |
| | | | 324/754.03 |
| 2008/0305440 A1 | 12/2008 | Willson | |
| 2009/0243153 A1* | 10/2009 | Sreenivasan | B82Y 40/00 |
| | | | 264/293 |
| 2009/0250840 A1* | 10/2009 | Selinidis | G03F 9/7076 |
| | | | 264/293 |
| 2010/0012622 A1* | 1/2010 | Panga | G03F 7/70483 |
| | | | 216/52 |
| 2010/0053578 A1* | 3/2010 | Sreenivasan | B82Y 10/00 |
| | | | 355/53 |
| 2012/0200005 A1* | 8/2012 | Sato | G03F 7/0002 |
| | | | 264/293 |
| 2014/0028686 A1* | 1/2014 | He | G02B 26/001 |
| | | | 257/E33.072 |
| 2014/0061969 A1* | 3/2014 | Okamoto | G03F 7/0002 |
| | | | 264/293 |
| 2014/0072668 A1* | 3/2014 | Yoneda | B29C 59/02 |
| | | | 428/157 |
| 2017/0047237 A1* | 2/2017 | Kobata | B24B 37/20 |
| 2017/0106399 A1* | 4/2017 | Sreenivasan | B81C 1/0038 |
| 2017/0333940 A1* | 11/2017 | Sreenivasan | B41J 2/01 |
| 2017/0351171 A1* | 12/2017 | Thompson | G03F 7/0002 |
| 2019/0080922 A1* | 3/2019 | Khusnatdinov | H01L 21/02345 |
| 2020/0047379 A1* | 2/2020 | Bamesberger | G03F 7/703 |
| 2020/0185230 A1* | 6/2020 | Ozturk | B29C 43/003 |
| 2020/0200959 A1* | 6/2020 | Bamesberger | G02B 6/102 |
| 2020/0286740 A1* | 9/2020 | De Young | H01L 21/67057 |
| 2021/0104400 A1* | 4/2021 | Choi | B29C 33/40 |
| 2021/0125855 A1* | 4/2021 | Roy | B29C 35/0805 |
| 2021/0132491 A1* | 5/2021 | Thompson | H01L 21/027 |
| 2021/0157229 A1* | 5/2021 | Cherala | H01L 21/68 |
| 2021/0159075 A1* | 5/2021 | Choi | B05D 3/067 |
| 2021/0191257 A1* | 6/2021 | Choi | G03F 7/0002 |
| 2021/0271161 A1* | 9/2021 | Roy | G03F 7/0002 |
| 2021/0305082 A1* | 9/2021 | Wan | H01L 21/6715 |
| 2021/0358746 A1* | 11/2021 | Choi | H01L 21/0201 |
| 2021/0407797 A1* | 12/2021 | Roy | H01L 21/6875 |

FOREIGN PATENT DOCUMENTS

| | | | |
|---|---|---|---|
| KR | 20160100255 A | 8/2016 | |
| WO | WO-2018027073 A1 * | 2/2018 | B82Y 40/00 |

* cited by examiner

RELEVANT ART

RELEVANT ART

RELEVANT ART

PLANARIZATION APPARATUS, PLANARIZATION PROCESS, AND METHOD OF MANUFACTURING AN ARTICLE

CROSS-REFERENCE TO RELATED APPLICATIONS

This application is a continuation of U.S. application Ser. No. 16/779,205 filed Jan. 31, 2020, which is incorporated by reference herein in its entirety.

BACKGROUND

Field of Art

The present disclosure relates to wafer processing, and more particularly, to the planarizing process of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArF laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

SUMMARY

A superstrate for planarizing a substrate is provided. The superstrate has a first side and a second side. The first side has a contact surface, and the second side has a central portion and a peripheral portion surrounding the central portion. The peripheral portion includes a recessed region. The recessed region is preferably, but optionally, concentric with the body. In one embodiment, the recessed region includes a stepped down surface extending circumferentially throughout the peripheral portion of the second side of the superstrate. The recessed region may include a tapered down surface extending circumferentially throughout the peripheral portion of the second side. The first side may include a mesa extending therefrom. The contact surface may be provided on the mesa. An edge of the mesa may be located at a radial width from the edge of the body. The recessed region of the second side may have a radial width wider than or equal to the radial width from the edge of the mesa to the edge of the body. The recessed region of the second side may have a radial width wider or the same as a radial width of the recessed peripheral portion of the first side. The recessed region may further comprise a trench extending circumferentially between the central portion and an edge of the second side.

A method is provided. The method comprises the following steps. A superstrate comprising a first side and a second side is provided. The first side has a contact surface. The second side has a central portion and a peripheral portion surrounding the central portion. The peripheral includes a recessed region. The superstrate is retained with a chuck at the second side of the superstrate. Pressure is applied to bend the superstrate with a curvature extending towards an edge of the superstrate. The method may further comprises advancing the superstrate towards the formable material by the chuck to bring a first surface of the superstrate into contact with the formable material. The formable material may be solidified to form a solid layer on the substrate and removing the superstrate from the solidified layer.

An apparatus is provided. The apparatus comprises a chuck comprising a plurality of lands defining a central zone and a peripheral zone surrounding the central zone. The apparatus also includes a superstrate with a second surface in contact with the lands of the chuck while being retained thereby. The superstrate comprises a first side and a second side is provided. The first side has a contact surface. The second side has a central portion and a peripheral portion surrounding the central portion. The peripheral includes a recessed region. The lands of the chuck may have a same height.

A method for forming an article is provided. The method comprises the following steps. A formable material is dispensed on a substrate. A superstrate is retained with a chuck at a second surface thereof. The superstrate comprises a first side and a second side is provided. The first side has a contact surface. The second side has a central portion and a peripheral portion surrounding the central portion. The peripheral includes a recessed region. A pressure is applied towards the superstrate to bend the superstrate with a curvature; wherein the curvature extends towards an edge of the superstrate. The superstrate is advanced to bring a first surface of the superstrate in contact with the formable material. The formable material is solidified to form a solid layer on the substrate. The superstrate is removed from the solidified layer. The substrate with the solidified layer is processed to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
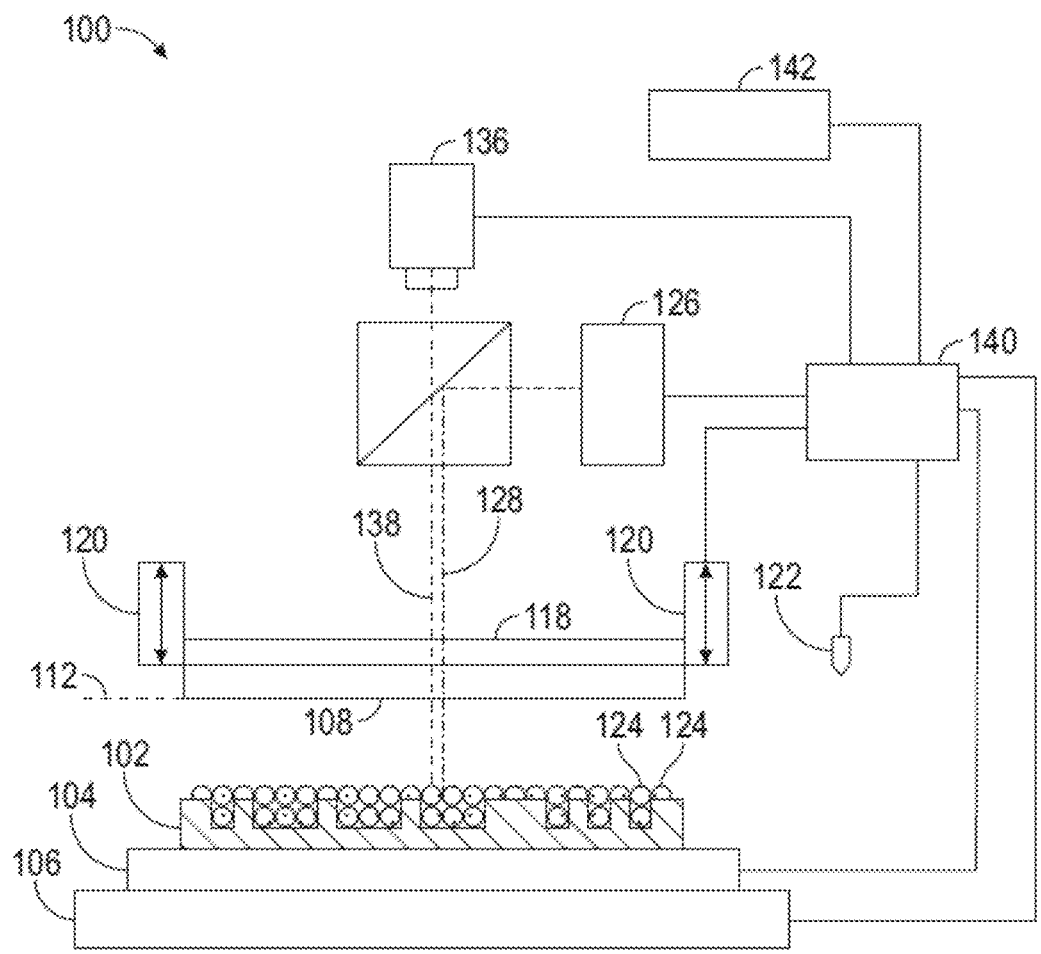
FIG. 1 is a diagram illustrating an apparatus.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates an apparatus 100 that, among other things, can be used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 102. Surface 112 of superstrate 108 can include a planar contact surface. In another embodiment, the contact surface can include features that define any original pattern that forms the basis of a pattern to be formed on the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/ or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the superstrate to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a head 120 which is a part of the positioning system. The head 120 may be movably coupled to a bridge (not shown). The head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The apparatus 100 may further comprise a fluid dispenser 122. The fluid dispenser 122 may also be movably coupled to the bridge. In an embodiment, the fluid dispenser 122 and the head 120 share one or more of all positioning components. In an alternative embodiment, the fluid dispenser 122 and the head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 further comprises a curing system that includes a radiation source 126 that directs actinic energy, for example, UV radiation, along an exposure path 128. The head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The apparatus 100 further comprises a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the superstrate chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, the planarization head 120, the substrate position stage 106, or both vary a distance between the superstrate 108 and the substrate 102 to define a desired space (a bounded physical extent in three dimensions) that is filled with the formable material 124. For example, the head 120 may be moved toward the substrate and apply a force to the superstrate 108 such that the superstrate contacts and spreads droplets of the formable material 124 as further detailed herein.

Planarization Process

Figure 2A:
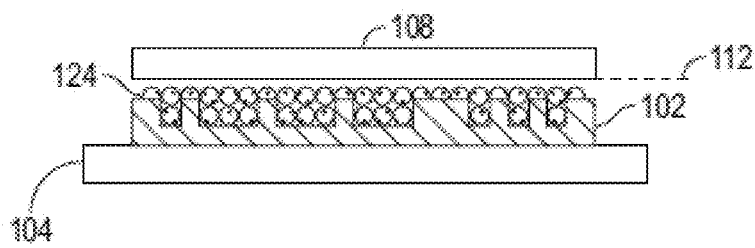
FIG. 2A to 2C illustrate a planarization process.
Figure 2B:
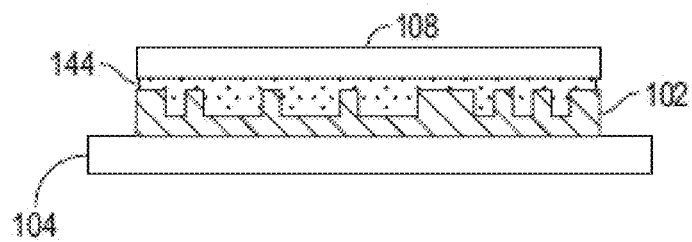
Figure 2C:
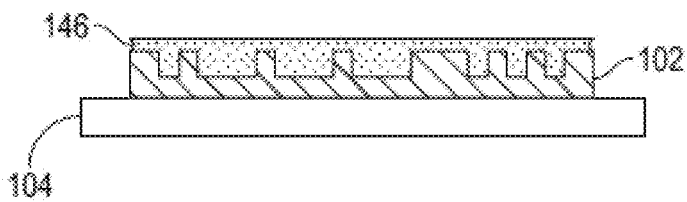

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2C illustrates the cured planarized layer 146 on the substrate 102 after separation of the superstrate 108.

In an alternative embodiment where the contact surface of superstrate 108 include pattern features, a similar process as described above can be performed to form a patterned layer on substrate 102 (e.g., "whole wafer" patterning). Whole wafer processing is useful in semiconductor device fabrication as well biological or optical device production. Such whole wafer processing can further be adapted such that local film thickness can be tuned as a function of desirable local film thickness.

Figure 3A:
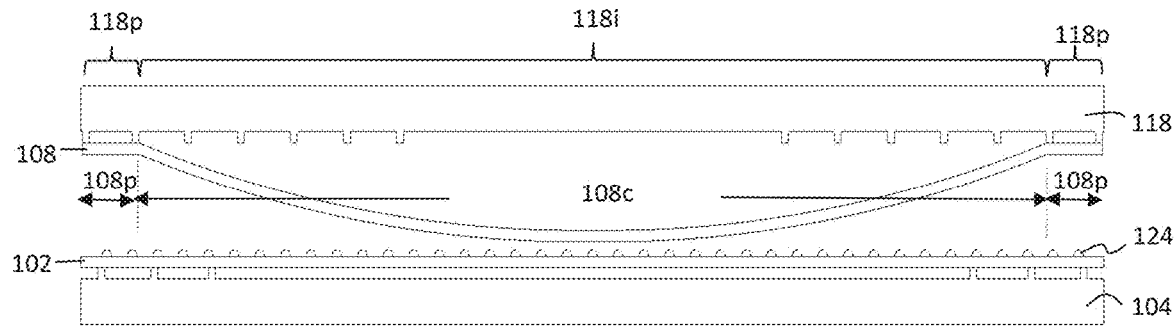
FIG. 3A to 3C illustrate a superstrate structure.
Figure 3B:
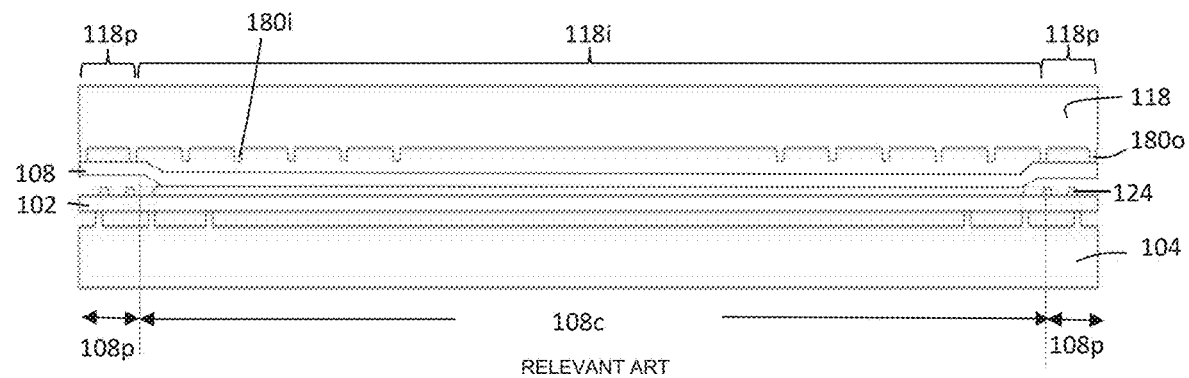
Figure 3C:
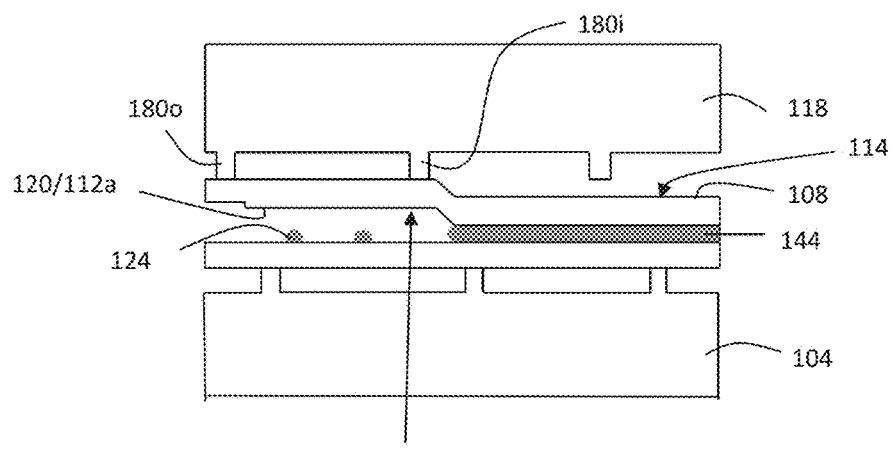

One scheme for minimizing entrapment of air or gas bubbles between the superstrate 108 and the substrate as the formable material droplets spread, merge and fill the gap between the superstrate and the substrate is to position the superstrate such that it makes initial contact with the formable material in the center of the substrate with further contact then proceeding radially in a center to perimeter fashion. This requires a deflection or bowing of the whole superstrate or substrate or both to create a curved profile of the superstrate relative to the substrate as contact progresses. This curvature facilitates the expulsion of gas or air as the superstrate contact with the substrate advances from the center toward the perimeter of the substrate, helping mitigate against air or gas entrapment. The deflection or bowing of the superstrate or substrate can be accomplished, for example, by using a vacuum chuck that applies a pressure to the central backside of the superstrate while retaining the superstrate via application of a holding vacuum about the perimeter of the backside of the superstrate. FIGS. 3A and 3B show a cross-section of the superstrate 108 as retained by a superstrate chuck 118 in such condition, and FIG. 3C shows an enlarged peripheral portion of FIG. 3B. In FIG. 3A, the formable material droplets are dispensed on the substrate 102 and the superstrate 108 is retained with the superstrate chuck 118. In FIG. 3B, the superstrate 108 is advanced to contact with the formable material 124. As shown, the superstrate 108 includes a first side 112 (also referred to a front side) in partial contact with formable material 124 positioned on the substrate 102 with pressure applied through interior zones 118i of superstrate chuck 118 to the central portion 108c of the second side 114 (also referred to as a back side) of the superstrate 108, while a vacuum is applied through a peripheral zone 118p of superstrate chuck 118 to the peripheral portion 108p of the second side 114 of superstrate 108 to keep the superstrate 108 chucked against the superstrate chuck 118. The interior zones are defined in part by spaced apart inner lands 180i with the peripheral zone 118p defined by in part by outer land 180o and the outermost inner land 180i. As a result, an interior portion 108c of the first side 112 of the superstrate 108 is bowed or curved at the contact interface, while the peripheral portion 108p of the superstrate 108 remains chucked flat against the peripheral zone 118p of chuck 118. When vacuum at the peripheral zone 108p is then released to complete the formable material spreading process, the flat peripheral portion then contacts the remaining droplets of formable material in a manner that may trap gas or air. This is because the peripheral portion 108p of superstrate 108 is oriented parallel with the substrate 102 and lacks the previous curved profile relative to the substrate 102 that facilitates the expulsion of gas or air.

A similar phenomenon can impact the separation of the superstrate 108 from the cured layer 146. To initiate a separation crack between the superstrate 108 and the cured layer 146, the peripheral edge of the superstrate, substrate, or both must bend to initiate or create a separation crack. Here, it is also desirable to separate superstrate 108 from cured layer 146 in a perimeter to center manner. This can be advantageous for controlling the rate of separation and applied forces, which in turn can reduce or mitigate the occurrence of separation defects, such as delamination of the cured layer 146 from the substrate 102. Creating a curved profile of the superstrate 108 relative to the substrate 102 can initiate a crack and facilitate such perimeter to center separation. However, the initial application of vacuum at the peripheral portion 108p of superstrate 108 cannot induce the desired curvature at the very outset of separation. This is because applying an initial vacuum through peripheral zone 118p of superstrate chuck 118 to the peripheral portion 108p of superstrate 108 rapidly brings the peripheral portion 108p into a parallel orientation to the superstrate chuck 118 without generating the desired curved profile that can initiate a crack and mitigate against separation defects.

Superstrate Structure

Figure 4A:
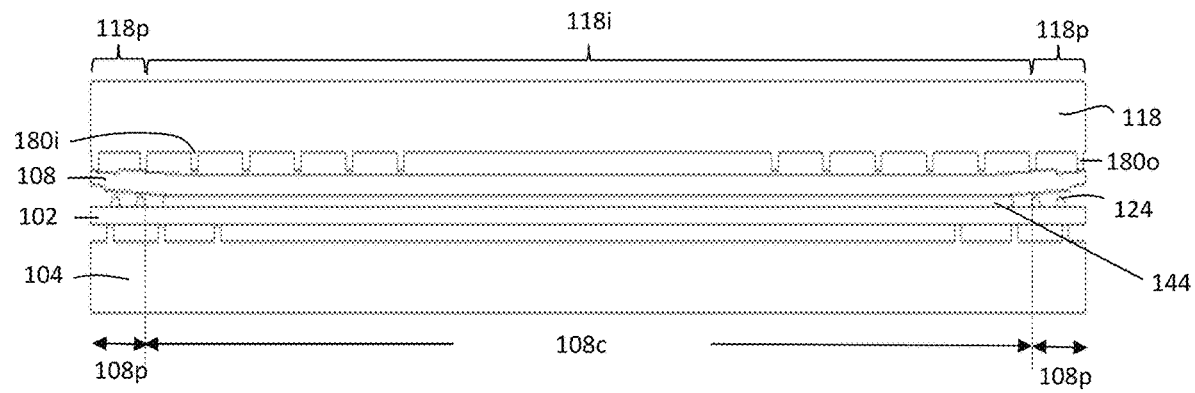
FIGS. 4A and 4B illustrates a modified superstrate structure.
Figure 4B:
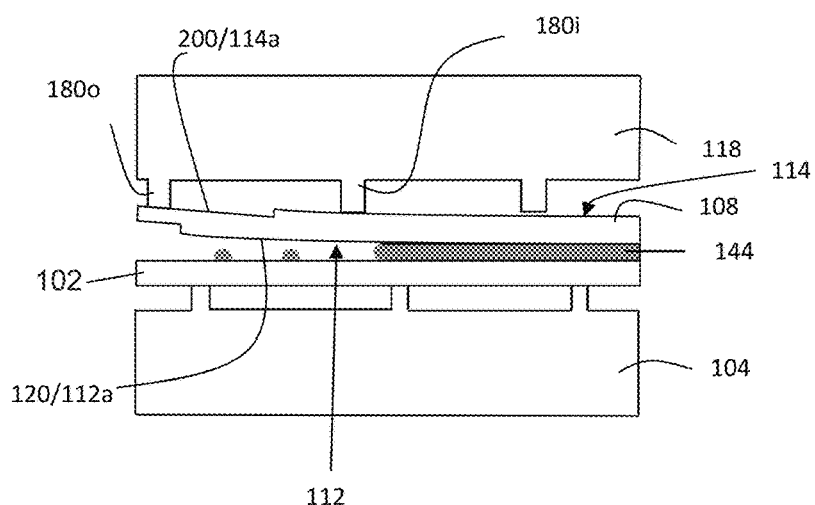
Figure 10:
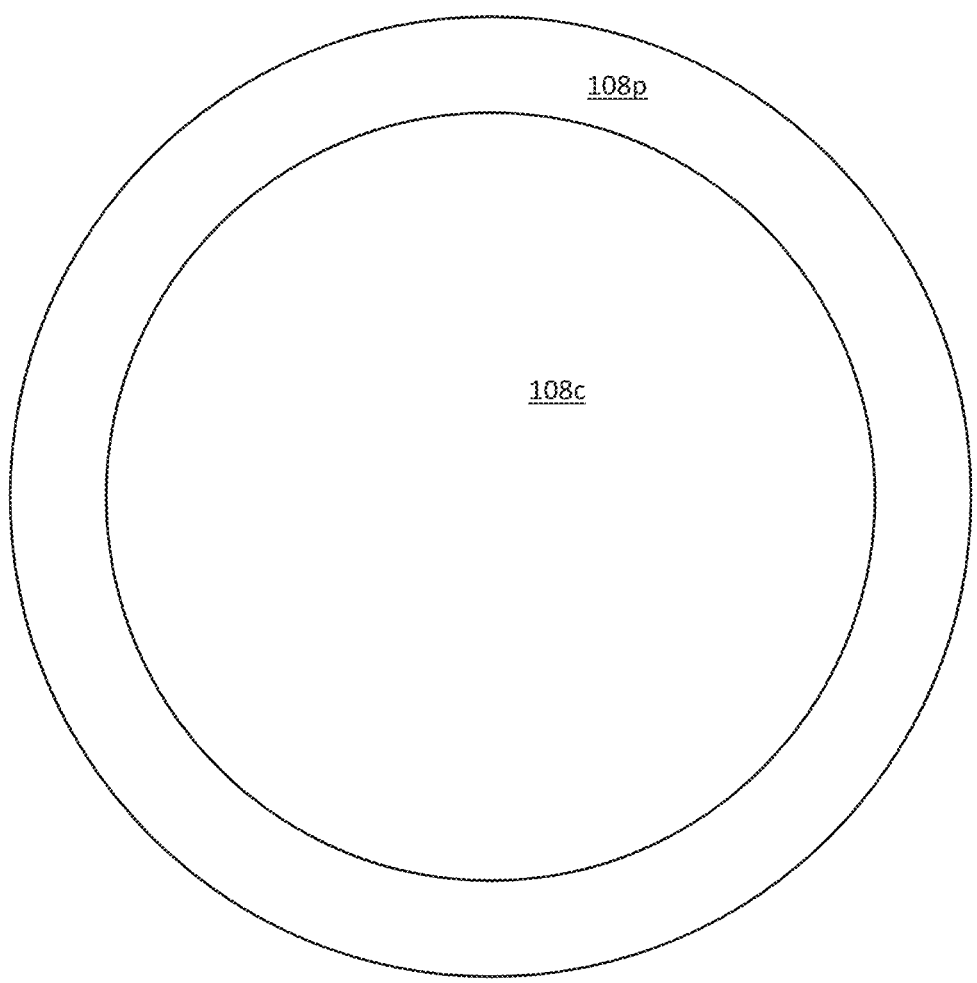
FIG. 10 shows a schematic top down view of the superstrate structure.

FIGS. 4A and 4B illustrates an embodiment of a superstrate structure that resolves the above described problems of air trapping and facilitates separation between the superstrate and the cured layer on the substrate. FIG. 10 shows a schematic top down view of the superstrate structure. As shown, superstrate 108 has a body that includes a first side 112 (also referred to as a front side) having a contact surface 112a and a second side 114 (also referred to as a back side) having a central portion 108c and a surrounding peripheral portion 108p, with the peripheral portion 108p including a recessed region 200. The recessed region 200 includes a stepped down surface 114a having a radial width and extending circumferentially about the peripheral portion 108p of the second side 114. Alternatively, the recessed region 200 can be tapered down from the peripheral portion 108p. In operation (as shown most clearly in FIG. 4B) when vacuum is supplied to peripheral zone 118p of superstrate chuck 118 and positive pressure is supplied to the interior zones 118i of the superstrate chuck 118, the central portion 108c of superstrate 108 is bowed towards the substrate 102 before making contact with the formable material 124, while the recessed region 200 is chucked against the outer land 1800, inducing a curved profile extending to the edge of the superstrate 108. The extent of the curvature is dependent on the step height of the recessed region 200 and width of the peripheral zone 108p. By extending the curvature in such fashion, both air or gas trapping and separation defects can be mitigated.

The contact surface 112a of superstrate 108 is optionally provided on a mesa 120 extending from the first side 112. The edge of mesa 120 is positioned at a radial width from the edge of the superstrate and acts a fluid control boundary that aids in containing the spreading of formable material 124 to within the area of the contact surface 112a and limiting the undesirable spreading of formable material to the substrate or superstrate edges which can lead to defects in downstream processing.

Figure 5:
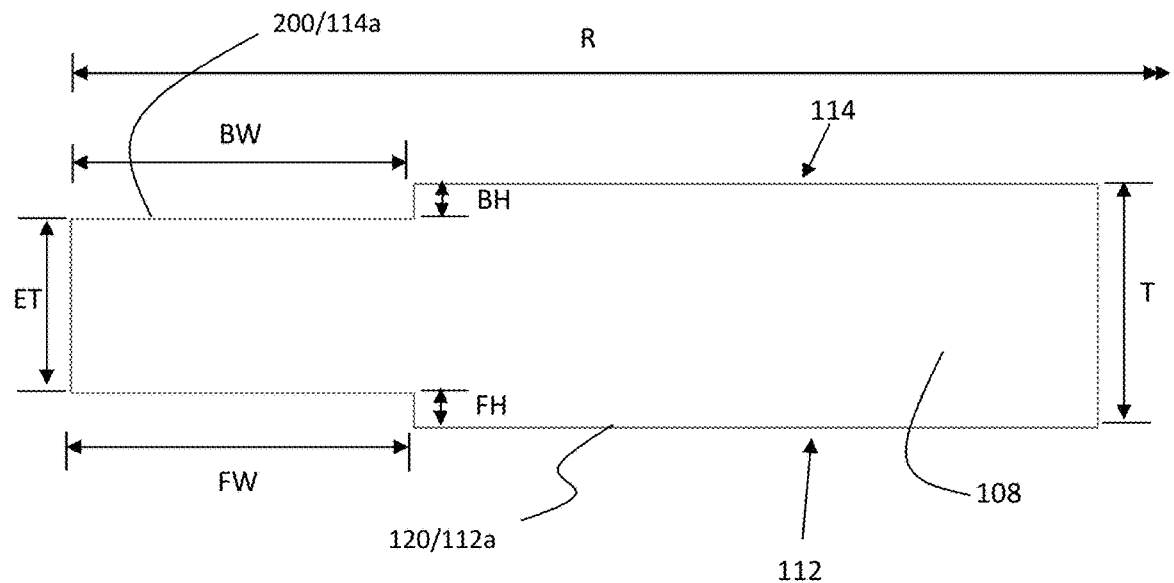
FIG. 5 is a cross sectional view of a peripheral structure of a superstrate in one embodiment.
Figure 6:
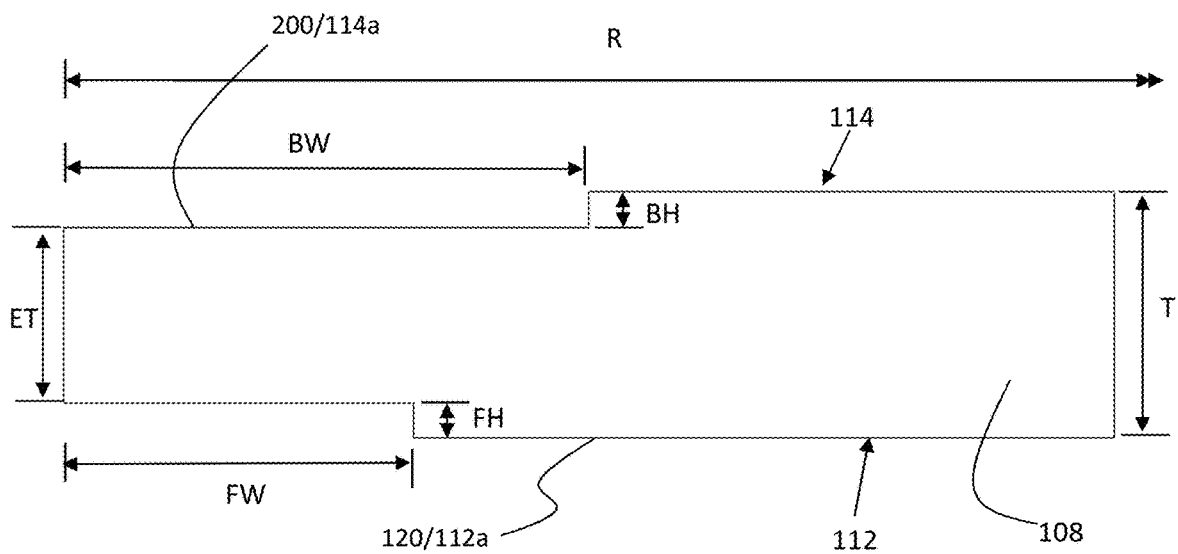
FIG. 6 is a cross sectional view of a peripheral structure of a superstrate in another embodiment.

The mesa 120 and the recessed region 200 can be independently formed on the front side 112 and the back side 114 of body 108 by adding or removing material on the superstrate 108 using e.g. standard lithography or machining techniques. For example, the front side 112 and the back side 114 can be independently etched to define the desired step height of the recessed region 200, the desired height or extension of the mesa from the front side 112, and the desired thickness of the edge of the superstrate 108. The particular dimensions and geometric aspects of the recessed region 200 may vary according to specific needs of superstrate performance. As shown in FIG. 5, superstrate 108 has an inner thickness T and an edge thickness ET. The recessed region 200 on the back side 114 of the superstrate 108 has radial width BW extending circumferentially to the superstrate edge and a step height of BH from the stepped down surface 114a to the second side 114 surface. Width BW and step height BH can be determined with reference to the radial width of the peripheral zone of a corresponding superstrate chuck and the desired bending performance of the superstrate when used with the chuck, as discussed above. On the front side 112, the mesa 120 extends a step height FH from the front side 112 surface and at a radial gap width FW from the superstrate edge. Again, the mesa step height FH and gap width are determined based on desired fluid control characteristics. In the embodiment as shown in FIG. 5, the width BW is equal to FW. Alternatively, these widths can be non-equal, as shown, for example, in the embodiment depicted in FIG. 6. In certain embodiments, the superstrate can be made of glass and have a radius ranging from 149 to 165 mm, a central portion thickness T ranging from 0.3 mm to 1.5 mm, and a recessed region width BW ranging from 0.5 to 20 mm and step height BH ranging from 0.002 to 0.05 mm. When a front-side mesa is incorporated, the mesa height FH can range from 0.002 to 0.1 mm with a gap width FW from the mesa to superstrate edge ranging from 0.5 mm to 20 mm.

Figure 7:
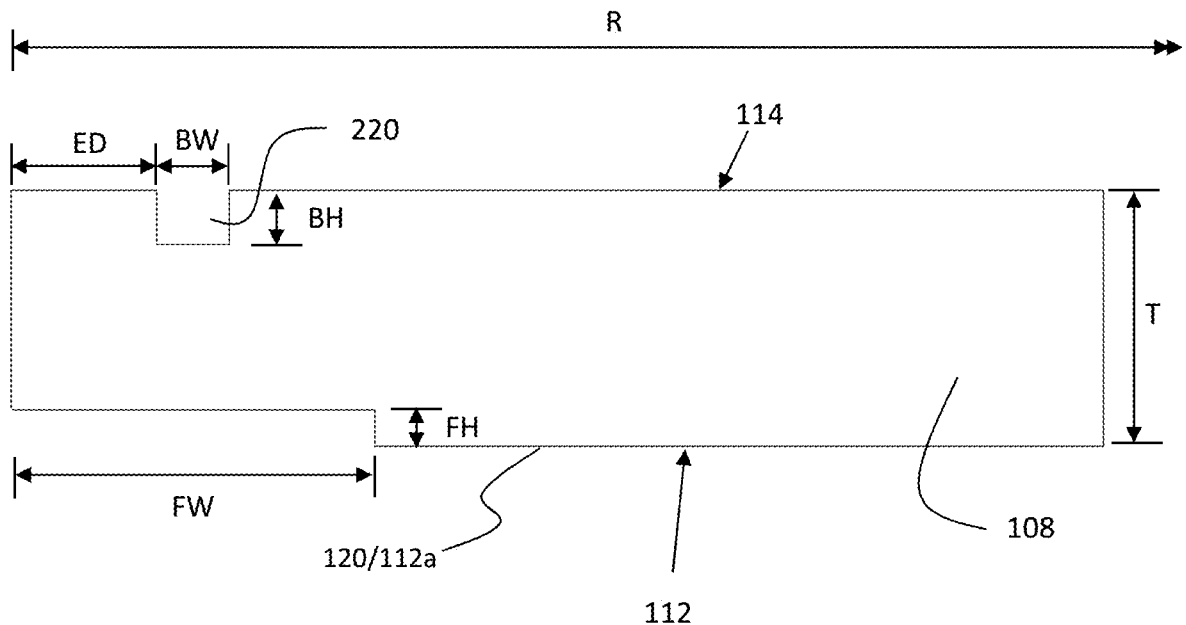
FIG. 7 is a cross sectional view of a peripheral structure of a superstrate in another embodiment.

In FIG. 7, the superstrate 108 includes a recessed region in the form of a trench 220 (or notch) that extends circumferentially around the perimeter region. The trench 220 has height BH and width BW dimensions such that notch 220 is able to receive at least the partial insertion of the outer land of a superstrate chuck. In so doing, a curved profile extending to the edge of the superstrate 108 can likewise be induced, similar to the previously discussed examples.

Figure 8:
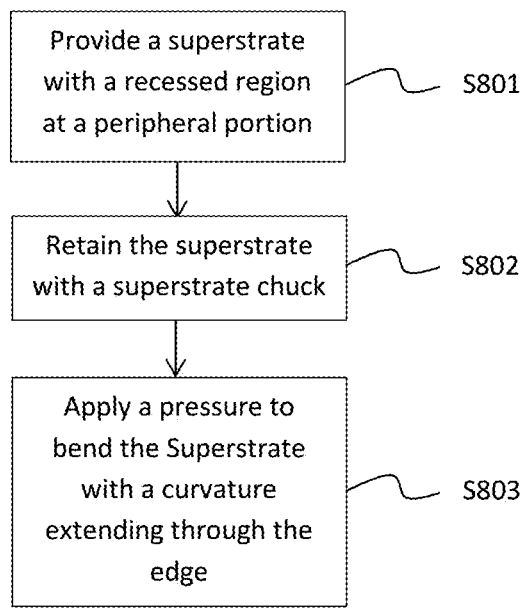
FIG. 8 shows a process of using a superstrate with a recessed region formed at a peripheral on the back side thereof.

FIG. 8 shows a process flow of a method using a superstrate having a recessed region at a peripheral portion of the backside of the superstrate. In Step S801, superstrate is provided having a recessed region at the peripheral portion of a back side surface of the superstrate. In step S802, the superstrate is retained by a superstrate chuck at the back side thereof. In step S803, a pressure is applied to the superstrate, such that the superstrate is bent with a curvature that extends through the edge of the superstrate.

Figure 9:
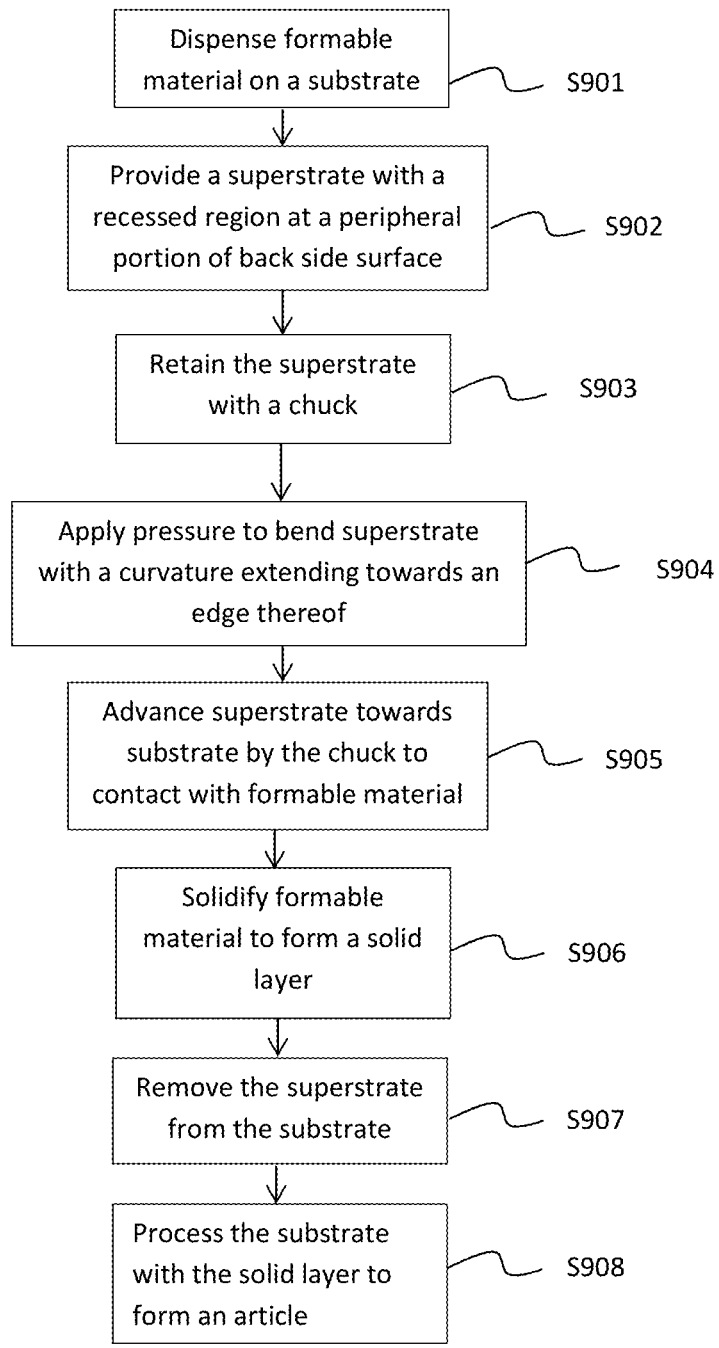
FIG. 9 shows a process of forming an article using a superstrate with a recessed region formed at a peripheral portion on the backside thereof.

FIG. 9 shows a process flow of a method for forming an article. In step S901, a formable material is dispensed on a substrate. In Step S902, superstrate is provided having a recessed region at the peripheral portion of a back side surface of the superstrate. The superstrate is retained with a chuck at the second surface in step S903. A pressure is applied to bend the superstrate with a curvature that extends towards an edge of the superstrate in step S904. The superstrate is then advanced by the chuck towards the substrate to contact with the formable material in step S905. The formable material is then solidified to form a solid layer on the substrate in step S906. In step S907, the superstrate is removed from the solidified layer, and the substrate with the solidified layer is processed to make the article in step S908. That is, the substrate and the solidified layer is then be subjected to additional known steps and processes for device (article) fabrication, including, for example, patterning, curing, oxidation, layer formation, deposition, doping, planarization, etching, formable material removal, dicing, bonding, and packaging, and the like. Further, the substrate may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A superstrate for planarizing a formable material on a substrate, wherein the superstrate is held by a chuck comprising a plurality of lands defining a central zone and a peripheral zone surrounding the central zone, the superstrate comprising:
    a first side and a second side opposite to the first side;
    an outermost edge; and
    a mesa formed on the first side, wherein an edge of the mesa is positioned inside from the outermost edge, and wherein the mesa has a planar contact surface to be in contact with the formable material on the substrate;
    wherein the second side has a central portion and a peripheral portion surrounding the central portion, and the peripheral portion includes a surface depressed in such a way as to form a step with respect to the central portion, and
    wherein the depressed surface of the superstrate held by the chuck has a contact surface to be in contact with an outer land among the plurality of lands of the chuck.

2. The superstrate of claim 1, wherein the depressed surface is concentric with the superstrate.

3. The superstrate of claim 1, wherein the depressed surface includes a stepped down surface extending circumferentially throughout the peripheral portion of the second side.

4. The superstrate of claim 1, wherein the depressed surface of the second side has a radial width wider than the radial width from the edge of the mesa to the edge of the superstrate.

5. The superstrate of claim 1, wherein the depressed surface of the second side has a radial width equal to the radial width from the edge of the mesa to the edge of the superstrate.

6. The superstrate of claim 1, wherein the depressed surface further comprises a trench extending circumferentially between the central portion and an edge of the second side.

7. A superstrate for planarizing a formable material on a substrate, the superstrate comprising:
    a first side and a second side opposite to the first side;
    an outermost edge; and
    a mesa formed on the first side, wherein an edge of the mesa is positioned inside from the outermost edge and wherein the mesa has a planar contact surface to be in contact with the formable material on the substrate, wherein the planar contact surface has no pattern feature,
    wherein the second side has a central portion and a peripheral portion surrounding the central portion, and the peripheral portion includes a surface depressed in such a way as to form a step with respect to the central portion, and
    wherein the depressed surface has a contact surface to be in contact with an outer land among a plurality of lands of a chuck configured to hold the superstrate.

8. The superstrate of claim 1, wherein the depressed surface is curved in a state that the contact surface of the depressed surface contacts the outer land among the plurality of lands of the chuck.

9. The superstrate of claim 1, wherein the planar contact surface has no pattern feature.

* * * * *